(12) United States Patent
Konno

(10) Patent No.: US 6,613,267 B1
(45) Date of Patent: Sep. 2, 2003

(54) METHOD FOR MANUFACTURING A HOLDER

(75) Inventor: Hideaki Konno, Tokyo (JP)

(73) Assignee: Polymatech Co., LTD (JP)

( * ) Notice: Subject to any disclaimer, the term of this patent is extended or adjusted under 35 U.S.C. 154(b) by 154 days.

(21) Appl. No.: 09/609,485

(22) Filed: Jul. 5, 2000

Related U.S. Application Data

(62) Division of application No. 09/215,013, filed on Dec. 17, 1998, now Pat. No. 6,217,349.

(30) Foreign Application Priority Data

Dec. 26, 1997 (JP) .............................................. 9-366619

(51) Int. Cl.[7] .......................... B29B 13/08; B29C 67/24
(52) U.S. Cl. ..................................... 264/437; 264/108
(58) Field of Search ................................ 264/437, 108, 264/109–128; 439/91, 86; 29/876, 877

(56) References Cited

U.S. PATENT DOCUMENTS

| | | | | |
|---|---|---|---|---|
| 3,684,817 A | * | 8/1972 | Card et al. | |
| 4,008,300 A | * | 2/1977 | Ponn ........................... | 264/104 |
| 4,113,981 A | * | 9/1978 | Fujita et al. ................. | 174/257 |
| 4,209,481 A | * | 6/1980 | Kashiro et al. ............. | 264/437 |
| 4,546,037 A | * | 10/1985 | King | |
| 4,737,112 A | * | 4/1988 | Jin et al. ...................... | 264/429 |
| 4,778,635 A | * | 10/1988 | Hechtman et al. .......... | 264/437 |
| 5,045,249 A | * | 9/1991 | Jin et al. ...................... | 264/437 |
| 5,305,188 A | * | 4/1994 | Kubo | |
| 5,397,240 A | * | 3/1995 | Herard ......................... | 439/91 |
| 5,735,698 A | * | 4/1998 | Bakker et al. ................ | 439/91 |
| 5,745,346 A | * | 4/1998 | Ogawa et al. ................ | 439/86 |
| 5,788,516 A | * | 8/1998 | Uggmark ...................... | 439/86 |
| 5,843,567 A | * | 12/1998 | Swift et al. .................... | 439/86 |
| 5,917,155 A | * | 6/1999 | Hake et al. .............. | 174/120 R |
| 5,917,709 A | * | 6/1999 | Johnson et al. ............. | 361/777 |
| 5,923,750 A | * | 7/1999 | Enting et al. | |
| 6,017,225 A | * | 1/2000 | Michiya et al. ............... | 439/86 |
| 6,058,020 A | * | 5/2000 | Winterer et al. | |

* cited by examiner

Primary Examiner—Stephen J. Lechert, Jr.
(74) Attorney, Agent, or Firm—McGlew and Tuttle, P.C.

(57) ABSTRACT

A method is provided for manufacturing a holder which has a holding part and a connector part. The holding part has an elastic body holding a built-in electronic part in a position. The method steps include pouring a liquid polymer mixed with a magnetic electric conductor into a mold for forming the holder. A magnetic force is applied to a desired position in the mold to orient the magnetic electric conductor to form a connector pattern of the connector part with the magnetic force. A holding part is molded integrally with the connector part to provide a one piece integral structure by crosslinking the liquid polymer. The magnetic electric conductor may be linked together by a force of a magnetic field. This defines a conductive passage in the connector part.

2 Claims, 5 Drawing Sheets

METHOD FOR MANUFACTURING A HOLDER

This is a Divisional of application Ser. No. 09/215,013 filed Dec. 17, 1998, U.S. Pat. No. 6,217,349 and the entire disclosure of this prior application is considered to be part of the disclosure of the accompanying application and is hereby incorporated by reference therein.

FIELD OF THE INVENTION

The present invention relates to a -holder and a manufacturing method thereof for holding on a substrate a small type microphone, a loudspeaker, etc. (built-in electronic parts) such as portable cellular telephone, personal handy phone system, personal digital assistant (PDA), or the like and electrically connecting them.

BACKGROUND ART

Electrodes of electronic parts of microphone, loudspeaker, etc. used for portable communication, equipment etc. is generally soldered to substrate electrodes by using lead wires. Since these connections have to be soldered via fine lead wires by means of manual work, this has a low productivity and increases in costs. Moreover, due to the lead wires, a larger space is required and this cannot correspond to requirement for miniaturization in recent years.

On the other hand, using a conductive elastic connector has developed a method of electrical interconnection between the electrodes.

However, since the conductive elastic connector has a laminated structure of an insulating elasticity part and a conductive elasticity and is manufactured by a special method, a manufacturing process different from that of a holder for mounting conventional electronic parts has to be adopted and is manufactured as a separate part, fine works are needed for positioning the electrodes of the electronic parts to those of the elastic connectors or the need arises for bonding the holder and the connector part to each other, and is still not allowed to have a satisfactory productivity and becomes costly.

SUMMARY OF THE INVENTION

It is an object of the present invention to solve the above-mentioned problems and to provide a holder and a manufacturing method thereof intended for simplifying an attaching process, decreasing a manufacturing cost, and reducing a mount space.

For the purpose of the above, the present invention provides a holder and a manufacturing method thereof, wherein electrodes of built-in electronic parts such as a small type microphone, a loudspeaker, or the like and those of a substrate are connected with each other by using a conductive elastic connector, and a holding part for holding the built-in electronic part and the elastic connector part are integrated into one piece for easily mounting the built-in electronic parts.

DETAILED DESCRIPTION OF THE PREFERRED EMBODIMENTS

Figure 1:
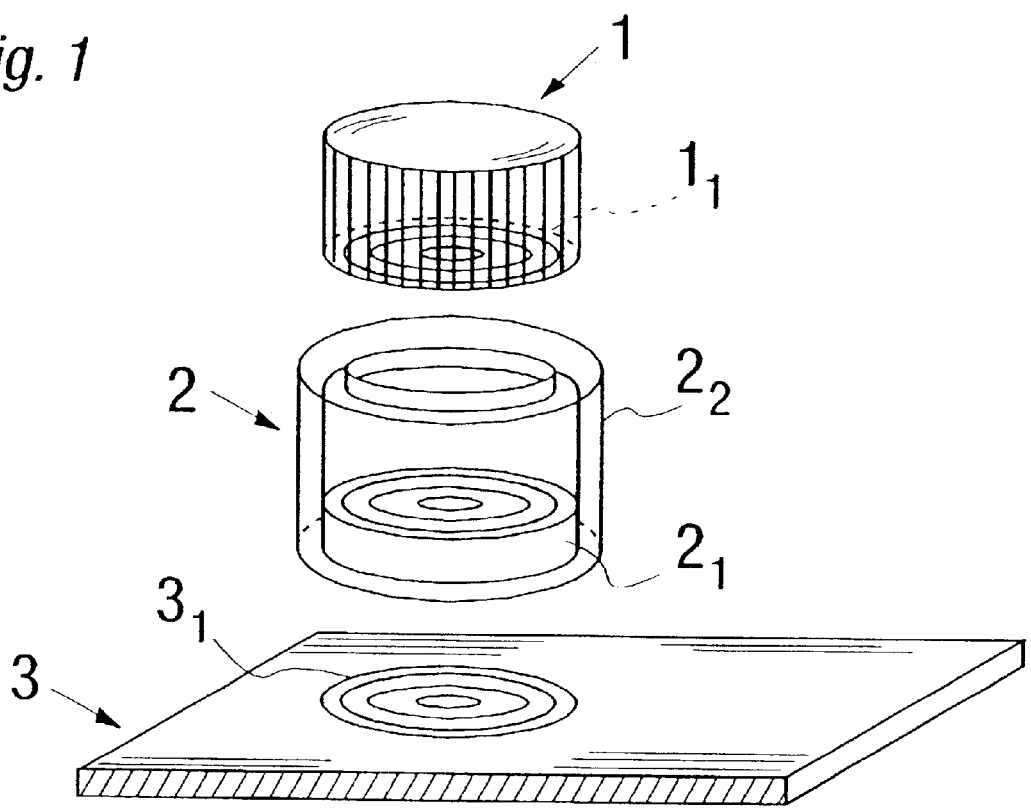
FIG. 1 is an exploded perspective view showing the holder in accordance with the present invention.

FIG.1 shows an exploded view of the holder in accordance with the present invention.

A conductive elastic connector part $2_1$ comprising rubber, etc. is used for an electric connection between electrodes $1_1$ of built-in electronic part 1 such as a small type microphone or loudspeaker, or the like and electrodes $3_1$ of a substrate 3, and a holding part $2_2$ of the holder are integrated into one piece in an elastic connector part $2_1$ so that the built-in electronic part 1 can easily be assembled.

The built-in electronic part 1 is pushed into the holder 2 for being engaged with a holding part $2_2$, and the electrodes $1_1$ on a bottom face of the built-in electronic part and the electrodes $3_1$ of the substrate 3 are brought into conduction via the conductive elastic connector part $2_1$.

For a conductive part of the conductive elastic connector $2_1$, a low resistance one is used considering an electric capacity of the built-in electronic part. A contact resistance of 10 Ω or less is preferred, and for a medium of the conductive part, low resistance metal powder, metal-plated carbon, graphite, etc., metal wire, etc. are desirable. A conductive pattern is formed on the conductive part in advance so that the electrodes $1_1$ of the built-in electronic part 1 are connected with the corresponding electrodes of the substrate $3_1$ respectively.

Figure 2:
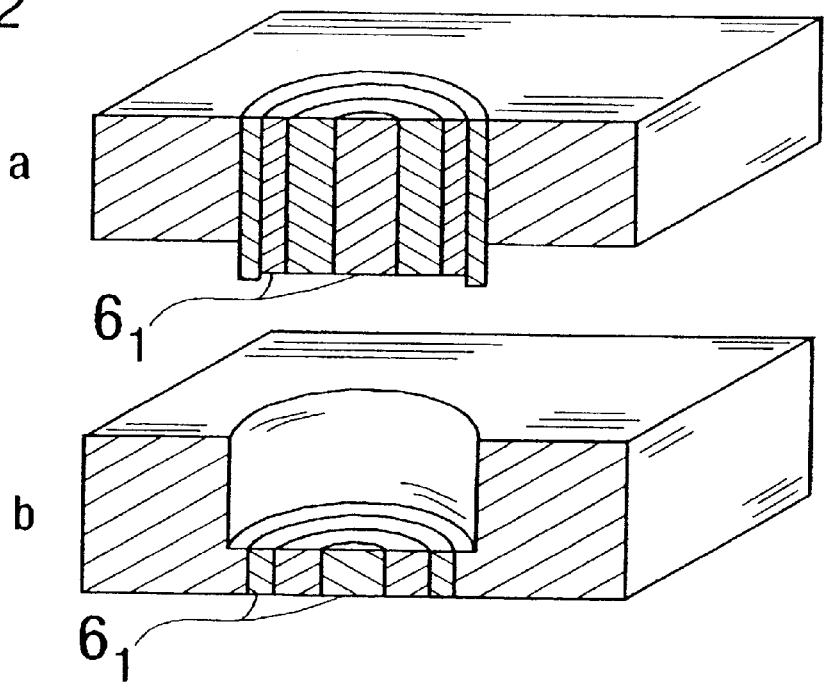
FIG. 2 is a cross-sectional view of a metallic mold.
Figure 3A:
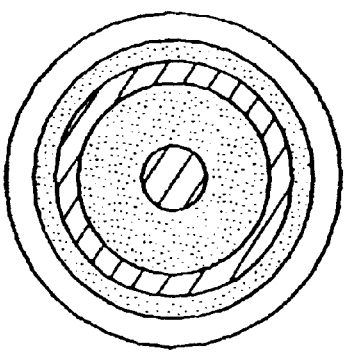
FIG. 3 is top views and cross sectional views of conductive patterns of the holder.
Figure 3A:
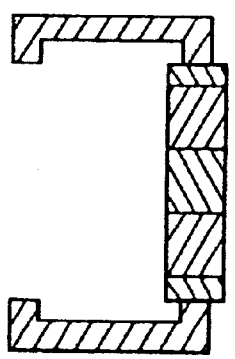
Figure 3B:
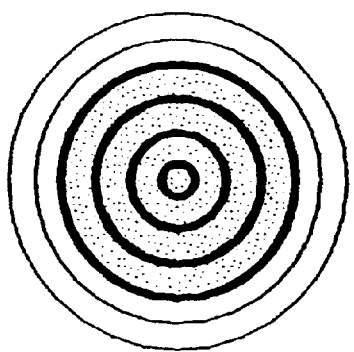
Figure 3B:
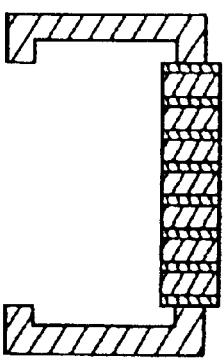
Figure 3C:
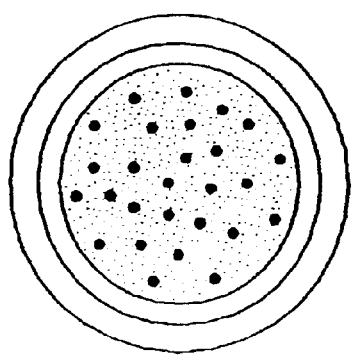
Figure 3C:
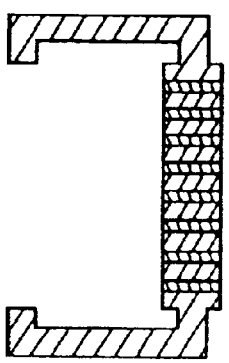
Figure 3D:
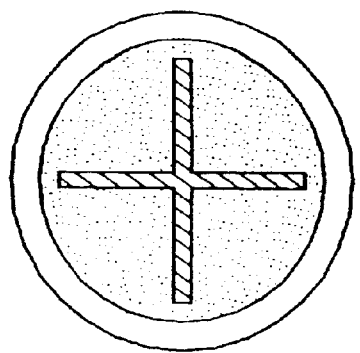
Figure 3D:
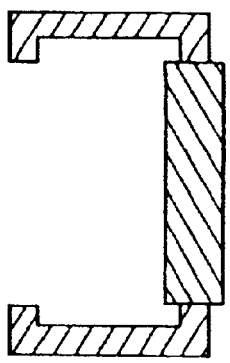

FIG. 2 shows the method for manufacturing the holder in accordance with the present invention.

A metallic mold is used in which a magnetic body 61 like iron or nickel alloys, etc. is buried in a same pattern as desired conductive pattern. The magnetic body $6_1$ in a punch (a) is projectingly formed so as to enter into a die (b), and the magnetic body $6_1$ is also buried in the bottom of the die (b).

This metallic mold is provided with a magnetic conductor chain formed by pouring into the die (b) a material which is liquid polymer such as silicone, urethane, etc. mixed with a magnetic conductor such as nickel, iron, cobalt, etc. or an alloy of these as main components, or conductor such as copper, aluminum, gold, silver, etc. plated with said magnetic conductive metals, or contrary to it, the magnetic conductive metal, etc. plated with the conductor, and vertically applying a magnetic force thereto and liking together the magnetic conductors in the material in the direction of the magnetic lines of force. Namely, since a magnetic conductive chain is oriented vertically to the elastic connector part $2_1$ in the figure, the elastic connector part $2_1$ is formed which has anisotropy bringing it into conduction only vertically. Then, the liquid polymer such as silicone, urethane, etc. in the metallic mold is cured by heat treatment, etc. and the holding part and the elastic connector part are integrated for completing the holder 2. Thus, the production is simplified and the built-in electronic part only may be fitted in the holder at a time of use, consequently, the need for fine works such as alignment of the electrodes is eliminated.

EMBODIMENT 1

FIG. 3 shows top views and cross-sectional views of the conductive patterns of the holder.

In the conductive part of the holder, the conductive pattern is formed so that the electrodes of the built-in electronic part can be connected with the corresponding electrodes of the substrate respectively. For example, as shown in FIG. 3, a type (a) of the same pattern as that of the electrodes 11 of the electronic part 1, a type (b) of a concentric conductive part, a type (c) of a random conductive part, a type (d) of cross-shaped conductive part, etc. are considered. Moreover, when the type (d) is oriented by a magnetic force, there is no leakage between the positive and negative electrodes.

Figure 4:
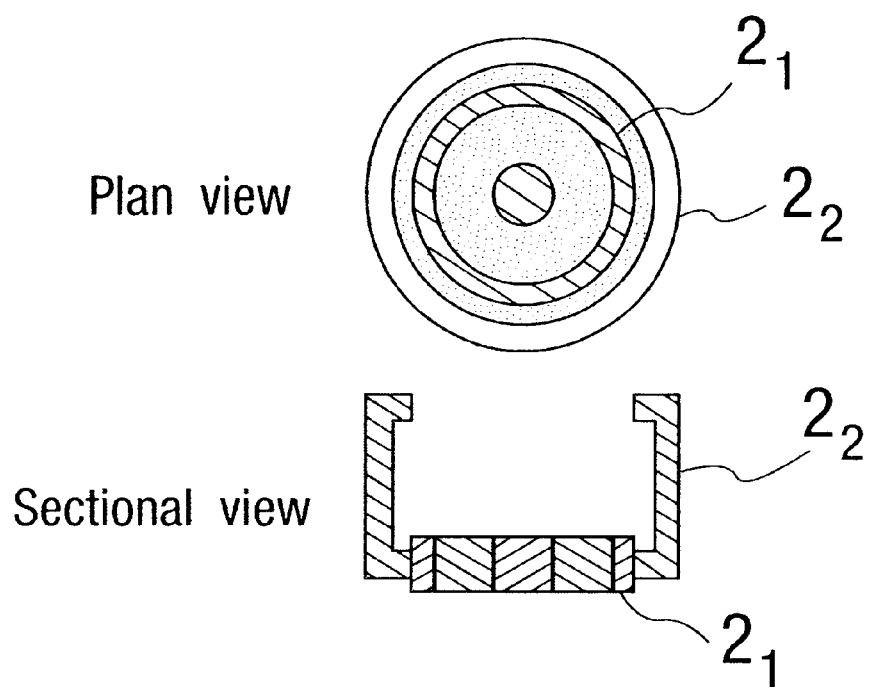
FIG. 4 is a plan view and a cross-sectional view of the holder.

In FIG. 4, the conductive elastic connector part $2_1$ has a shape vertically projected to the bottom of the holder $2_2$ for allowing the electrodes $1_1$ of the built-in electronic parts 1 to contact with the electrodes $3_1$ of the substrate satisfactorily, and is further designed to be appropriately compressed.

Figure 5:
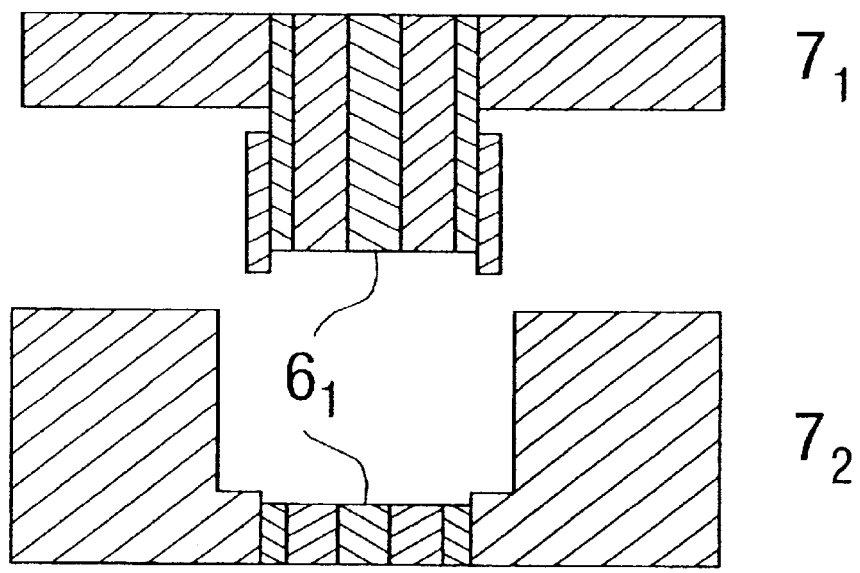
FIG. 5 is a cross-sectional view showing a molded state.

The holder shown in FIG. 4 is formed by using metallic mold 7 shown in FIG. 5. This metallic mold is not specifically restricted on the material unless it has magnetism, materials such as aluminum, various alloys, or resin, etc. can be used. In this metallic mold, the magnetic materials $6_1$ of the same pattern as the conductive part are buried at desired positions in the punch and die. The material buried in the metallic mold is not specifically restricted if it bas magnetism, and alloys of iron, nickel cobalt chrome, etc. may be used.

EMBODIMENT 2

A manufacturing method for products of the embodiment 1 will be described.

A material, which is a mire of 100 pts. Wt. of liquid silicone rubber (Wacker Chemical Co., Ltd. LR7665A/B) and 5–50 pts. Wt. of nickel powder and well mixed and defoamed, poured into the die $7_1$ of the metallic mold 7, and a magnetic field (a magnetic density=499 gaus)is applied the material from beneath to above the die $7_1$ so as to orient the nickel powder to the conductive pattern. And then, the punch $7_2$ is put thereon and said liquid silicone rubber is cured by applying heat of 120° C. for obtaining the holder shown in FIG. 4. Here, it was to prevent the nickel powder from sneaking in the holding part $2_2$ while a magnetic field was applied to the die $7_1$ in which the material had been poured and the nickel powder was oriented to the pattern of the conductive part.

If the amount of nickel powder to be added is less than 5 pts. Wt., there is a danger that a part is formed wherein nickel particle chain may not pass through the conductive elastic connector part $2_1$ in the vertical direction. Contrasted with this, if the nickel powder amount exceeds 50 pts. Wt., there is a danger that the central circle part of the conductive elastic connector part $2_1$ and the circumferential part may be brought into electrical conduction and leakage. Therefore, an addition of 5–50 pts. wt. of nickel powder to 100 pts wt. of liquid silicone rubber is desirable, more preferably, 10–20 pts. wt.

Table 1 shows a relationship between a particle diameter of the magnetic conductive powder and a resistance value of the conductive elastic connector part.

Resistance values of the conductive elastic connector part $2_1$ of the obtained holder 2 were dependent on a particle diameter of the nickel powder, and the larger the particle diameter of the nickel powder was, the lower and the more stable resistance value was obtained. When a holder 2 having a low and stable resistance value is only desired, for example, nickel powder of a 125 μm or larger particle diameter can be used. However, the larger the particle diameter of the nickel powder is, there is a tendency that the dispersibility becomes worse, therefore, the smaller the particle diameter is, the more beautiful a conductive pattern is formed. Consequently, when it is desired to form a beautiful conductive pattern and obtain a stable and low resistance, for example, it is desirable to use gold- or silver-coated nickel powder of 30 μm to 40 μm particle diameter.

Table 2 shows orientation time depending on viscosity of liquid polymer and particle diameter of nickel powder. The viscosity of the liquid polymer influences on the orientation time of the nickel powder. Basically, the lower the viscosity is, the shorter the orientation time is, and this is advantageous for a forming cycle. However, since there is a tendency that the lower the viscosity of the polymer is, the physical properties becomes worse after being cured, a desirable polymer viscosity is 10P to 2500P, more preferably, it is 100P to 1000P.

An example of a method for assembling the holder 2 in accordance with the present invention is described as the following.

When a conductive elastic connector is used, the elastic connector part needs to be compressed to some extent in the assembling method to obtain a stable conduction. Although a compression rate is generally set depending on a thickness of the elastic connector part, 8–20% is a proper range.

Figure 6:
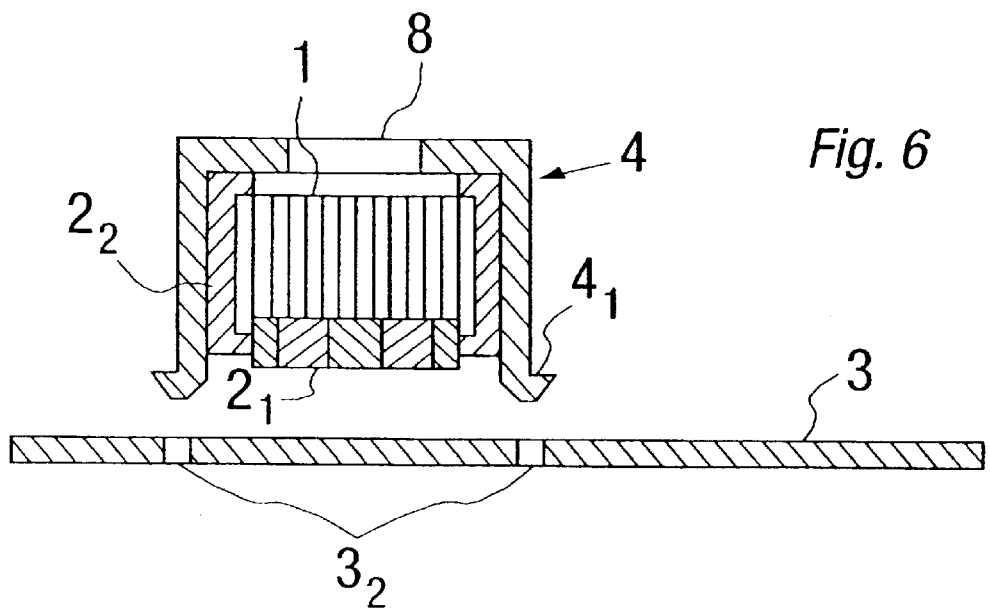
FIG. 6 is an assembly drawing showing a method of assembling a holder on a substrate.

In an assembling method shown in FIG. 6, the elastic connector part 2 is comprised of a material, for example, resin, etc. having a compressible hardness; an attaching bracket 4 provided with a hole 8 at a desired position is provided separately; and the holder 2 having been engaged with the built-in electronic part 1 is attached in the bracket 4. Attaching parts $4_1$ of the attaching bracket 4 are inserted into attaching holes $3_2$ in the substrate 3 for fixing. At the same time, the elastic connector part $2_1$ is compressed by the attaching bracket 4 and the substrate 3 and results in showing a stable resistance.

Figure 7:
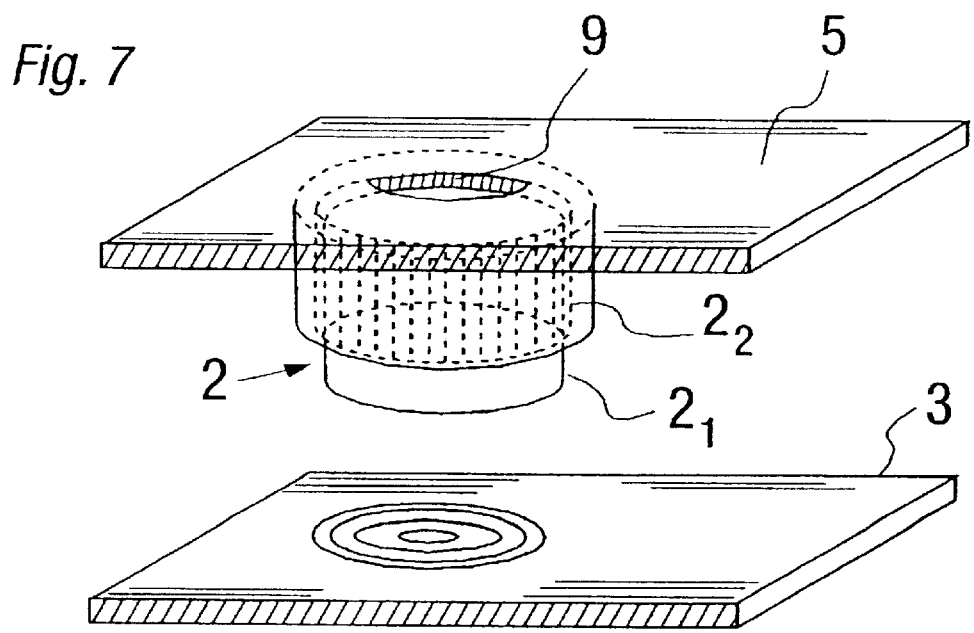
FIG. 7 is an assembly drawing showing another method of assembling a holder on a substrate.

FIG. 7 shows another assembling method, whereby a microphone holder 2 is assembled, which is an integrated piece of the elastic connector part $2_1$ and the holding part $2_2$ having assembled the built-in electronic part 1 in a case 5 provided with a hole 9 at a desirable position. When the case 5 is assembled on a main body, the elastic connector 2₁ is pressed between the case 5 and the substrate 3 and is brought into a stable conduction. Consequently, since only a part assembly process will be performed without a soldering process for connecting lead wires, etc., the assembling simply becomes possible for anybody.

Since the holder in accordance with the present invention is an integrated,piece of the elastic connector part and the holding part used for attaching electronic parts of a microphone being used on a portable telephone equipment, etc to the substrate. Moreover, since the soldering process for connecting lead wires, etc. can be eliminated, a parts count and manufacturing man-hours can be reduced, and the manufacturing costs are reducible.

Further, according to the manufacturing method of the present invention, it is possible to easily manufacture the holder which is an integrated piece of a complex shape of the holding part and the elastic connector part.

What is claimed is:

1. A method for manufacturing a holder which has a holding part, having an elastic body holding a built-in electronic part in a position, and a connector part, the method comprising the steps of:

pouring a liquid polymer mixed with a magnetic electric conductor into a mold for forming the holder having tire holding part and the connector part;

applying a magnetic force to a desired position in the mold to orient the magnetic electric conductor to form a connector pattern of the or part with the magnetic force; and molding the holding part integrally with the connector part to provide a one piece integral structure by crosslinkng the liquid polymer.

2. The method according to claim 1, wherein the magnetic electric conductor is linked together by a force of a magnetic field, and thereby a conductive passage is defined In the connector part.

* * * * *